US010882501B2

(12) United States Patent
Scholl et al.

(10) Patent No.: US 10,882,501 B2
(45) Date of Patent: Jan. 5, 2021

(54) SWITCHING DEVICE AND METHOD FOR SWITCHING LOADS

(71) Applicant: KNORR-BREMSE SYSTEME FUER NUTZFAHRZEUGE GMBH, Munich (DE)

(72) Inventors: Frank Scholl, Ingersheim (DE); Johannes Appl, Sachsenheim (DE); Michael Belling, Renningen (DE)

(73) Assignee: KNORR-BREMSE SYSTEME FUER NUTZFAHRZEUGE GMBH, Munich (DE)

(*) Notice: Subject to any disclaimer, the term of this patent is extended or adjusted under 35 U.S.C. 154(b) by 406 days.

(21) Appl. No.: 15/758,991

(22) PCT Filed: Sep. 6, 2016

(86) PCT No.: PCT/EP2016/070901
§ 371 (c)(1),
(2) Date: Mar. 9, 2018

(87) PCT Pub. No.: WO2017/042139
PCT Pub. Date: Mar. 16, 2017

(65) Prior Publication Data
US 2018/0251109 A1    Sep. 6, 2018

(30) Foreign Application Priority Data

Sep. 10, 2015    (DE) .................. 10 2015 115 280

(51) Int. Cl.
B60T 8/88    (2006.01)
F02D 41/20   (2006.01)
(Continued)

(52) U.S. Cl.
CPC .............. B60T 8/885 (2013.01); F02D 41/20 (2013.01); H01F 7/1811 (2013.01);
(Continued)

(58) Field of Classification Search
CPC ......... B60T 8/885; F02D 41/20; H01F 7/1811
See application file for complete search history.

(56) References Cited

U.S. PATENT DOCUMENTS 5,729,164 A * 3/1998 Pattantyus .............. B60T 8/885
                                                      327/110
6,505,609 B1 * 1/2003 Biester .................... F02D 41/20
                                                      123/479
(Continued)

FOREIGN PATENT DOCUMENTS

DE          19513621 A1    10/1996
DE      102008001114 A1    10/2009
(Continued)

OTHER PUBLICATIONS

International Search Report dated Nov. 10, 2016, of the corresponding International Application PCT/EP2016/070901 filed Sep. 6, 2016.

Primary Examiner — Scott Bauer
(74) Attorney, Agent, or Firm — Norton Rose Fulbright US LLP; Gerard Messina

(57) ABSTRACT

A switching apparatus for switching a first actuator and a second actuator between a power supply and a ground, including: a first switch for switching a first current path between the first actuator and the ground; a second switch for switching a second current path between the second actuator and the ground; and a third switch for switching a current path between the power supply and the first actuator and a current path between the power supply and the second actuator; in which, as a result of the switching, the third switch simultaneously closes or opens the current path to the first actuator and to the second actuator. Also described are a related brake system and method.

15 Claims, 7 Drawing Sheets

(51) Int. Cl.
    *H01F 7/18*        (2006.01)
    *H03K 17/16*      (2006.01)
    *H03K 17/687*    (2006.01)

(52) U.S. Cl.
    CPC ....... *H03K 17/162* (2013.01); *H03K 17/6874* (2013.01); *F02D 2041/2082* (2013.01); *H01F 2007/1888* (2013.01); *H03K 2217/0063* (2013.01); *H03K 2217/0072* (2013.01)

(56) References Cited

U.S. PATENT DOCUMENTS

| | | | |
|---|---|---|---|
| 2005/0146408 A1* | 7/2005 | Traversa | F02D 41/20 335/220 |
| 2006/0293815 A1* | 12/2006 | McCann | B60G 17/01908 701/37 |
| 2008/0002324 A1 | 1/2008 | Logiudice et al. | |

FOREIGN PATENT DOCUMENTS

| | | |
|---|---|---|
| DE | 102011089228 A1 | 6/2013 |
| DE | 102012203940 A1 | 9/2013 |
| DE | 102012214774 A1 | 2/2014 |

\* cited by examiner

SWITCHING DEVICE AND METHOD FOR SWITCHING LOADS

FIELD OF THE INVENTION

The present invention relates to a switching apparatus and a method for switching loads and, in particular, for switching actuators.

BACKGROUND INFORMATION

To prevent instances of undesired activation of loads (such as actuators, for example) in safety-relevant applications, both the positive and the negative terminal are often switched in control devices. Such double protection is used, for example, in anti-lock braking systems or electronic brake systems, wherein the actuators are pressure-controlled valves (PCVs), for example. In this case, one of the two switches can be jointly embodied for a plurality of actuators and can remain permanently switched on during operation. Moreover, further switches can be provided, which can individually activate the actuators by connecting individual terminals (for example in the case of regulating intervention), such that individual actuators can be actuated in a targeted manner.

For the case where a connection to the positive terminal is intended to be switched by a common switch (high-side switch), there is often the problem that a permanently present positive potential leads to corrosion at the connectors to the actuators. In conventional systems, therefore, common switches are used for the negative terminal (low-side switch) and individual actuators are activated by individual high-side switches. Due to the permanently switched-on (closed) low-side switch, there is therefore no potential between the actuators and the ground (for example vehicle ground). As a result, the problem of corrosion is prevented. The high-side switches are often preceded by a further, additional high-side switch, which may be configured, for example, as a relay or as a semiconductor switch and which isolates the positive potential of the battery from the system in the case of system disconnection or in the event of a fault in a high-side switch.

FIG. 7 shows such a conventional switching design. It is based on a common low-side switch and individual high-side switches. For example, in actuators for ABS or EBS control devices, a separate high-side switch can be provided for each valve.

FIG. 7 shows, in detail, a first actuator 101, a second actuator 102, a first high-side switch 610, a second high-side switch 620, a third high-side switch 615 and a low-side switch 630.

In the switching design of FIG. 7, there is also a voltage source 105, which has a pole connected to ground 107. The other pole (high-side) provides a power supply for the circuitry.

The low-side switch 630 is in this case electrically connected both between the first actuator 101 and the ground 107 and between the second actuator 102 and the ground 107. The first actuator 101 is arranged between the first high-side switch 610 and the low-side switch 630. The second actuator 102 is arranged between the second high-side switch 620 and the low-side switch 630. The third high-side switch 615 is connected between the voltage source 101 (that is to say the pole not connected to ground) and the first high-side switch 610 and between the voltage source 101 and the second high-side switch 620. The low-side switch 630, the first high-side switch 610, the second high-side switch 620 and the third high-side switch 615 are actuated by control lines 685 and can therefore be opened or closed selectively by a control unit (not shown in FIG. 7) in order to provide or to interrupt current paths through the first actuator 101 and/or the second actuator 102 selectively.

There may also be further actuators, which are not shown in FIG. 7, but which likewise have separate, further high-side switches, wherein, in each case, one further actuator is connected between the respective further high-side switch and the low-side switch 630. These further, additional actuators are therefore also connected to the ground 107 by the third low-side switch 630. In the event of a fault, the common low-side switch 630 can therefore switch off all the actuators. The third high-side switch 615 illustrated in FIG. 7 as a relay likewise serves to switch off the actuators in the event of a fault and to isolate the positive potential of the battery voltage 101 from the system. The actuators can represent electro-pneumatic or electro-hydraulic valves, for example.

However, high-side switches are generally costly and not available as a mass-produced product at low cost. On the other hand, available application-specific integrated circuits (ASICs) often contain efficient low-side switches whose functions are often not used optimally. Available individual low-side switches or multiple low-side switches are likewise less expensive and more efficient than corresponding high-side switches. To be able to use such switches in a system and for switching actuators, the switching design needs to change.

SUMMARY OF THE INVENTION

The present invention is based on the object of providing a switching apparatus and a method for switching loads that overcome the abovementioned disadvantages.

This object may be achieved by a switching apparatus as described herein and a switching method as described herein. The further descriptions herein relate to advantageous developments of the subject matter of the main descriptions herein.

The present invention relates to a switching apparatus for switching a first actuator and a second actuator between a power supply and a ground. The apparatus comprises a first switch for switching a first current path between the first actuator and the ground; a second switch for switching a second current path between the second actuator and the ground; and a third switch for switching a current path between the power supply and the first actuator and a current path between the power supply and the second actuator. As a result of the switching, the third switch closes or opens the current path to the first actuator and simultaneously to the second actuator.

Switching should be understood to mean both opening and closing an electric current path such that electrical charge carriers can move along the current path. The term actuator can likewise be interpreted broadly and can comprise all forms of loads that are accordingly operated or activated by a current feed.

In further exemplary embodiments, the first switch and the second switch are each a low-side switch and the third switch is a high-side switch.

In further exemplary embodiments, the first switch and/or the second switch and/or the third switch comprise a semiconductor switching unit or a relay. In further exemplary embodiments, the semiconductor switching unit comprises a field-effect transistor. The field-effect transistor may comprise any kind of field-effect transistors suitable for switching, such as a MOSFET, MISFET, JFET, IGFET, for example. In further exemplary embodiments, the field-effect transistor can be replaced by a bipolar transistor or another semiconductor component capable of switching.

In further exemplary embodiments, the field-effect transistor of the first switch is a first field-effect transistor and the field-effect transistor of the second switch is a further field-effect transistor and the switching apparatus further comprises a first voltage-limiting element (for example a Zener diode) and a further voltage-limiting element (for example a Zener diode). The first voltage-limiting element can be formed (or connected) in parallel with the first field-effect transistor and the further voltage-limiting element can be formed (or connected) in parallel with the further field-effect transistor, wherein the first and the further voltage-limiting element are arranged in such a way that, in normal operation, they suppress a flow of current and, when a minimum voltage is exceeded, become conducting, in order to thus prevent voltage peaks across the first and the further field-effect transistor.

The voltage-limiting element can be any kind of semiconductor component suitable for providing overvoltage protection, that is to say has a voltage-dependent resistance and, in particular, becomes conductive above the minimum voltage.

In further exemplary embodiments, the third switch comprises a first switching unit and a second switching unit, which are connected in series and can be switched independently of one another.

In further exemplary embodiments, the first switching unit and the second switching unit of the third switch each comprise a semiconductor component (for example a field-effect transistor) and are interconnected with one another in antiseries in order to provide polarity-reversal protection.

In further exemplary embodiments, the first switching unit is connected between the second switching unit and the power supply and a voltage-limiting element is formed in parallel with the semiconductor component of the second switching unit.

Many actuators are operated magnetically and comprise, for example, an electromagnet, which, given a flow of current, opens or closes valves, for example, or performs other operations. In the case of sudden disconnection of such actuators, the electromagnetic field still contains enough field energy that cannot be disconnected immediately. A "removal" of the actuators may therefore be expedient, where said field energy that is still present in the system is eliminated. The removal can take place here slowly or quickly.

These functions are provided in further exemplary embodiments by virtue of the fact that the switching apparatus comprises at least one supplementary diode and at least one supplementary switch, which are each interconnected in series and bypass the first actuator and/or the second actuator in order to accelerate or to slow the removal of the first actuator and/or the second actuator by switching the at least one supplementary switch.

In further exemplary embodiments, the at least one supplementary diode can optionally comprise a plurality of supplementary diodes and the at least one supplementary switch can optionally be one supplementary switch, which are connected in such a way that, in each case, one of the plurality of supplementary diodes and the supplementary switch are connected in parallel with the first and with the second actuator such that closed circuits for the first and the second actuator are formed by closing the one supplementary switch in order to accelerate the removal of the first actuator and the second actuator (quick removal). The closed circuit leads through the respective actuator, the supplementary diode and the supplementary switch. Closing the supplementary switch now brings about the accelerated removal and opening brings about the slowed removal of the respective actuator. The slowing is carried out by the closed flow of current, which leads to a slow subsidence of the actuator.

In further exemplary embodiments, the switching apparatus comprises a control unit, wherein the control unit is configured to close or to open the first switch together with the third switch or the second switch together with the third switch.

In further exemplary embodiments, the control unit is optionally configured to close or to open the third switch before or after the first switch or before or after the second switch.

In further exemplary embodiments, the control unit is optionally configured to make it possible to slowly remove the first actuator and/or the second actuator by opening the first and/or the second switching unit and/or by closing the at least one supplementary switch. The control unit can also be configured to make it possible to quickly remove the first actuator and/or the second actuator by opening the first and/or the second switching unit and/or the at least one supplementary switch.

The present invention also relates to a brake system of a vehicle having at least one first pressure-controlled valve and one second pressure-controlled valve and a switching apparatus as described above, wherein the first actuator is the first pressure-controlled valve and the second actuator is the second pressure-controlled valve.

The present invention also relates to a method for switching at least one first actuator and one second actuator between a power supply and a ground. The method comprises the following steps: switching a first switch in order to establish or to interrupt a first current path between the first actuator and the ground and/or switching a second switch in order to establish or to interrupt a second current path between the second actuator and the ground. The method further comprises switching a third switch in order to establish or to interrupt a current path between the power supply and the first actuator and/or a current path between the power supply and the second actuator, wherein switching the third switch closes or opens the current path to the first actuator and simultaneously to the second actuator.

The stated order of the steps does not imply any temporal sequence or only insofar as is absolutely necessary. All the functions of the above-described apparatus can likewise be implemented as part of the method. The number of controlled pressure valves and/or actuators is likewise arbitrary, that is to say, further exemplary embodiments also comprise additional pressure valves and/or actuators.

The exemplary embodiments of the present invention are better understood from the following detailed description and the appended drawings of the different exemplary embodiments, which should not, however, be understood as restricting the disclosure to the specific embodiments but as serving merely for explanation and understanding.

DETAILED DESCRIPTION

Figure 1:
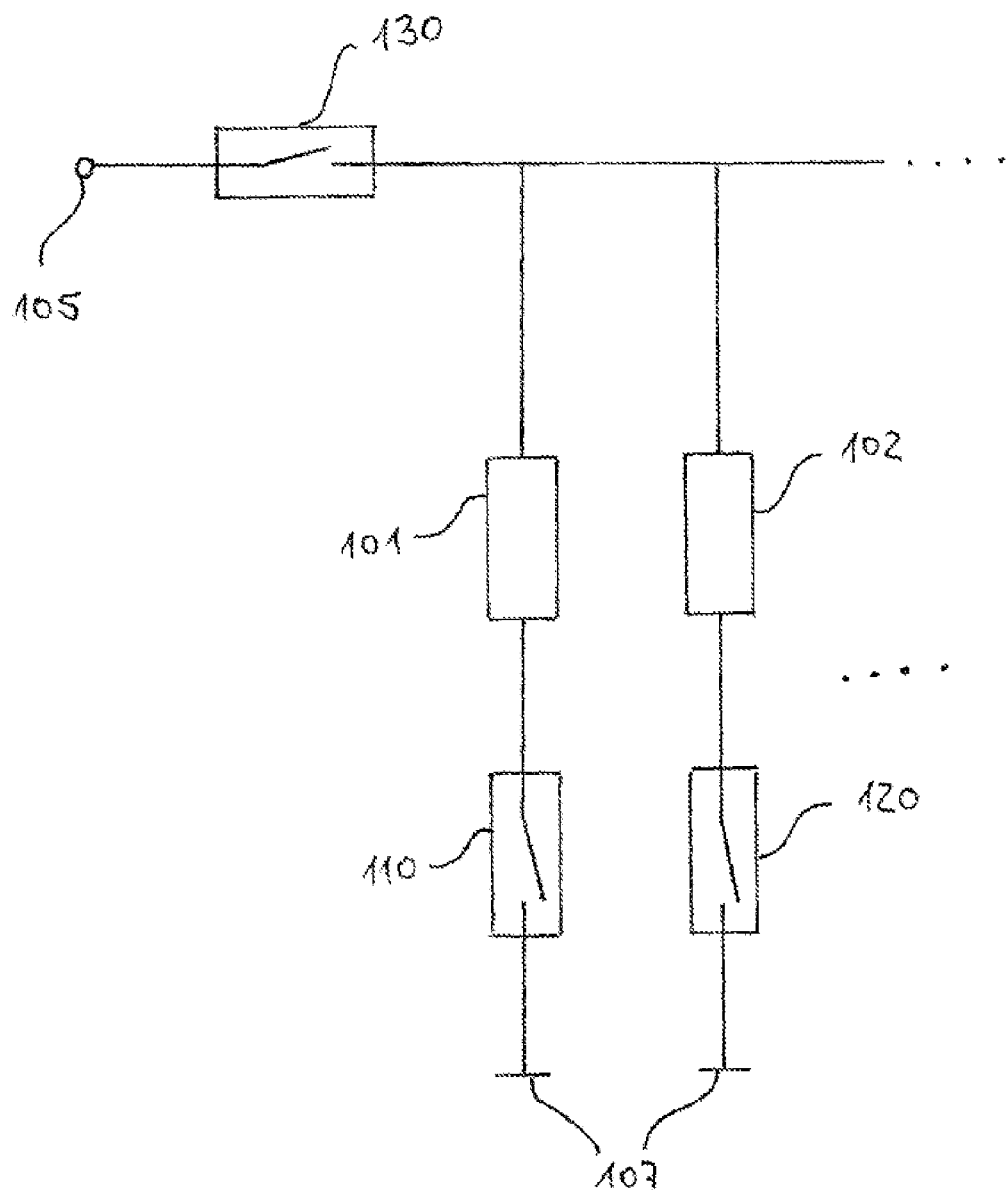
FIG. 1 shows a switching design in accordance with one exemplary embodiment of the present invention.

FIG. 1 shows a switching apparatus in accordance with one exemplary embodiment of the present invention. The switching apparatus is suitable for switching a first actuator 101 and a second actuator 102 between a power supply 105 and a ground 107. The switching apparatus comprises the following features: a first switch 110 for switching a first current path between the first actuator 101 and the ground 107; a second switch 120 for switching a second current path between the second actuator 102 and the ground 107; and a third switch 130 for switching a current path between the power supply 105 and the first actuator 101 and a current path between the power supply 105 and the second actuator 102, wherein switching the third switch 130 closes or opens the current path to the first actuator 101 and simultaneously to the second actuator 102. As shown in FIG. 1, for this purpose, the current path can branch off downstream from the third switch (proceeding from the power supply 105) and lead to the first and second actuator 101, 102.

In further exemplary embodiments, the actuators are arbitrary loads that do not need to belong to the switching apparatus but are only connected by said switching apparatus to a power or voltage supply.

Figure 2:
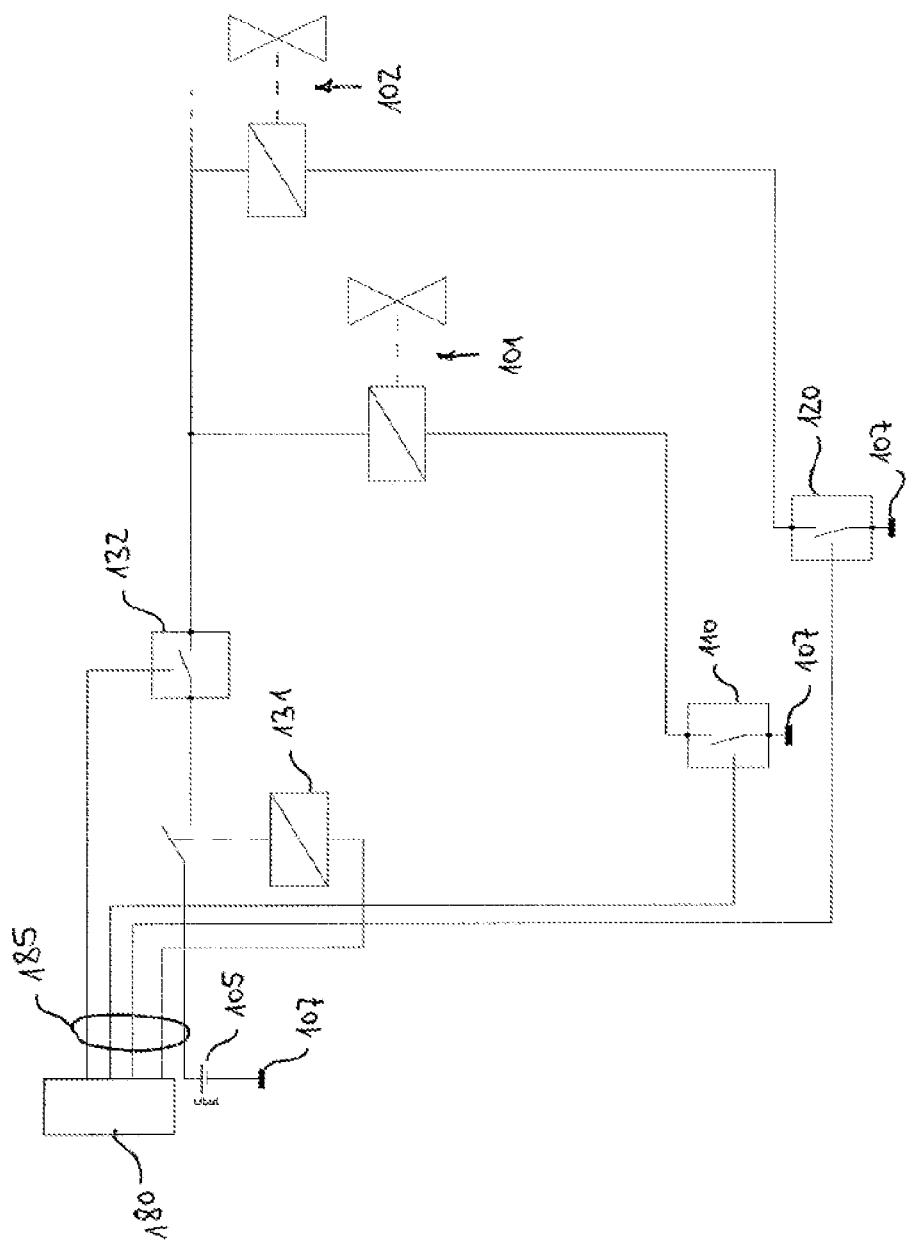
FIG. 2 shows a further exemplary embodiment having two high-side switches.

FIG. 2 shows a further exemplary embodiment of the present invention, wherein the third switch 130 has a first switching unit 131 and a second switching unit 132. The first switching unit 131 is connected between the second switching unit 132 and the power supply 105 (or the voltage source). Between the second switching unit 132 and the ground 107, the second actuator 102 is connected in series with the second switch 120. Between the second switching unit 132 and the ground 107, the first actuator 101 and the first switch 110 are also connected in series. In these series interconnections, the second switch 120 is connected between the second actuator 102 and the ground 107 and the first switch 110 is connected between the first actuator 101 and the ground 107.

The switching apparatus in accordance with the shown exemplary embodiment further comprises a control unit 180. The first switching unit 131, the second switching unit 132, the first switch 110 and the second switch 120 are also connected to the control unit 180 by control lines 185. The control unit 180 is configured to open and close the individual switches 110, 120, 130 and switch units 131, 132, respectively, selectively.

The first actuator 101 and the second actuator 102 can be, for example, magnet-controlled valves or other actuators that can be operated by a voltage or current feed. In further exemplary embodiments, in addition to the first actuator 101 and the second actuator 102, further actuators are provided, which are likewise connected between the second switching unit 132 and the ground 107 in series with further switches, and specifically arranged in the same manner as the first actuator 101 and the second actuator 102 in FIG. 2. The presence of said further actuators is indicated in FIG. 2 by the dashed line above the second actuator 102.

In the exemplary embodiment shown in FIG. 2, the first current path thus runs from the power or voltage source 105 via the first switching unit 131, the second switching unit 132, the first actuator 101 and the first switch 110 to the ground 107 (or vice versa). The second current path runs from the power or voltage source 105 via the first switching unit 131, the second switching unit 132, the second actuator 102 and the second switch 102 to the ground 107 (or vice versa).

One pole of the voltage supply is connected to the ground 107 such that the other pole represents the power supply 105 or the high-side (high potential in comparison to the ground 107). The first switching unit 131 and the second switching unit 132 are therefore high-side switches. On the other hand, the first switch 110 and the second switch 120 are each low-side switches, since they couple directly to the ground 107.

The control unit 180 is now configured to switch the third switch 130 (the first switching unit 131 and/or the second switching unit 132) when one of the actuators 101, 102 is intended to be actuated. The control unit 180 switches at least one of the low-side switches 110, 120 at the same time in order thus to close (or to open) at least one current path. To prevent frequent switching, the control unit 180 can be further configured to activate the high-side switch 130 only when a regulating intervention is currently imminent. Such a regulating intervention can be, for example, actuation of the end stages for operation of the actuators, such as, for example, opening or closing pressure-controlled valves or the like.

In further exemplary embodiments, it is advantageous when the high-side switch 130 is switched on even somewhat before the desired switch-on time of the corresponding actuator 101, 102 and/or is switched somewhat after said time. This can be expedient, for example, when a new regulating intervention is imminent.

In accordance with the present invention, the high-side and low-side switches are thus interchanged accordingly. Since the low-side switches are less expensive and more efficient and there is also a greater variety of low-side switches, an arrangement of this kind is cost-efficient and therefore advantageous. With this design, it is likewise possible to utilize application-specific integrated circuits, which already have low-side switches integrated therein. Since the high-side switch 130 is also actuated only when at least one of the actuators is intended to be actuated (or in the case of test pulses), there is the same protection against corrosion as is possible in conventional systems. A further advantage consists in being able to dispense with an additional preceding high-side switch, in particular when the high-side switches 130 are embodied as semiconductor components, which switch more quickly than a relay and are less sensitive to mechanical stresses, such as shaking, for example. The first switching unit 131 or the second switching unit 132 is therefore optional. Further exemplary embodiments therefore comprise either the first switching unit 131 or the second switching unit 132, but not both.

Figure 3:
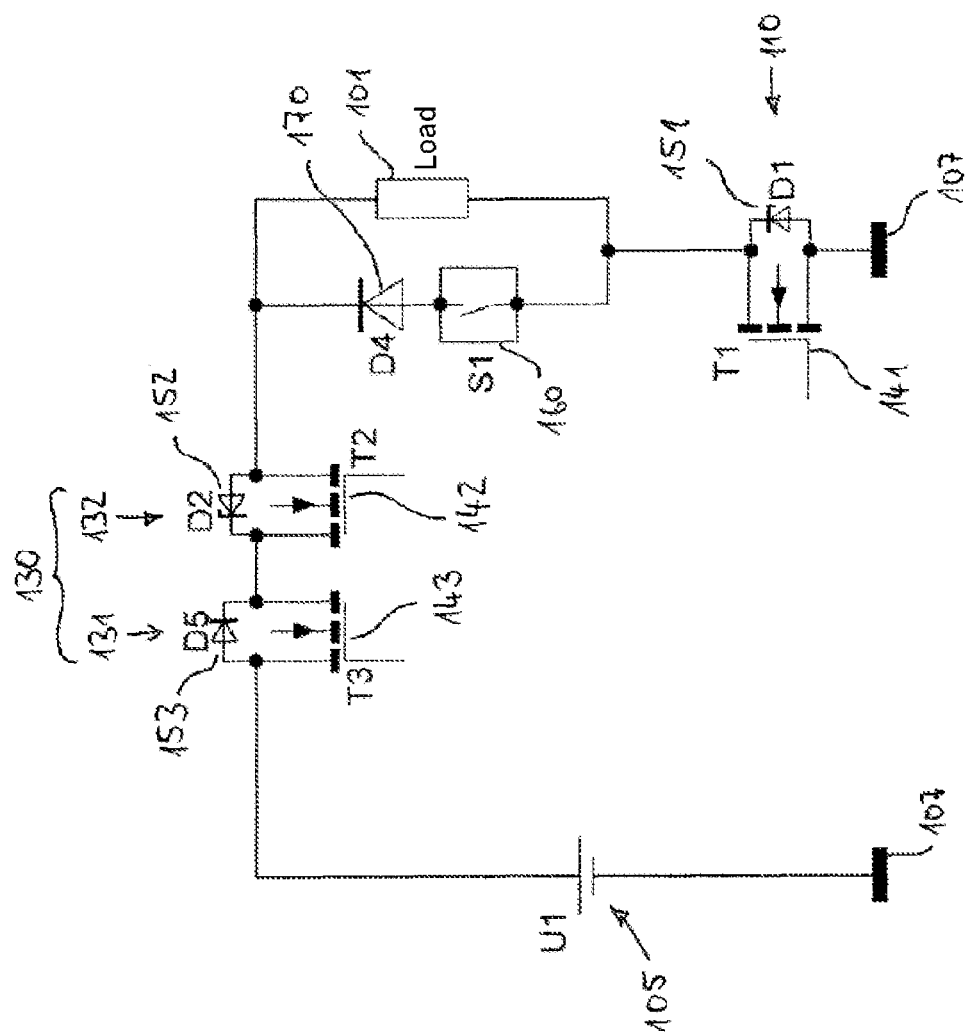
FIG. 3 shows one exemplary embodiment having semiconductor components as switches.

FIG. 3 shows a further exemplary embodiment of the present invention in which the switches are configured as semiconductor components. FIG. 3 shows just one load 101, which may correspond, for example, to one of the actuators 101, 102 from FIG. 2. Said one load 101 is shown purely for simplification and is not to be interpreted as restrictive. Instead, in further exemplary embodiments, there may be a plurality of load elements, which are arranged in a similar manner to the actuators 101, 102 from FIG. 2.

In the exemplary embodiment shown, the first switch 110 comprises a first transistor 141 (T1) and a first diode 151 (D1). The second switching unit 132 comprises a second transistor 142 (T2) and a second diode 152 (D2) and the first switching unit 131 comprises a third transistor 143 (T3) and a third diode 153 (D5). The transistors can be field-effect transistors (FETs) and the diodes can be arranged as follows. The first diode 151 is formed in parallel with the first transistor 141, the second diode 152 is formed in parallel with the second transistor 142 and the third diode 153 is formed in parallel with the third transistor 143. Diodes like the first to third diode 151, 152, 153 are always present in a field-effect transistor, but in this case serve as illustration (as an equivalent circuit diagram) in order to better understand the following functions. Said diodes are realized by the bulk contact (or substrate contact) in the field-effect transistors, wherein the direction is given by the two options for contacting the FET substrate (connection to source or drain). They can optionally be configured as Zener diodes in order to provide overvoltage protection. The diodes are in this case connected or polarized in such a way that only a low current flows through them when an actuator is deactivated.

In the exemplary embodiment shown, there is also a first supplementary switch 160 and a supplementary diode 170, which are interconnected with one another in series and bypass the load 101. The arrangement of the first switching unit 131, the second switching unit 132, the load 101 and the third switch 130 is analogous here to the exemplary embodiment shown in FIG. 2. The third switch 130 is therefore arranged between the voltage source 105 and the load 101 and specifically in such a way that the first switching unit 131 is connected between the second switching unit 132 and the voltage source 101 and the second switching unit 132 is connected between the first switching unit 131 and the load 101. The first switch 110 is also connected between the ground 107 and the load 101 such that a current path, proceeding from the voltage source 105, first passes the first switching unit 131, then the second switching unit 132, then the load 101 and finally passes the first switch 110 before the current reaches the ground 107 (or the flow of current flows in reverse thereto).

The first switching unit 131 and the second switching unit 132 are in this case connected in antiseries in order to provide polarity-reversal protection. The second diode 152 may be configured as a Zener diode, for example. The first diode 151 may likewise be configured as a Zener diode in the first switch 110. Said Zener diodes provide the protection. For example, sudden disconnection of the load 101 may result in voltage peaks, which should not be present at the second transistor 142 or the first transistor 141. Since the Zener diodes are voltage-limiting elements, they serve as protection for the transistors. However, the Zener diodes D1 and D2 serve not only for protection but also induce quick deactivation of the actuator 101 due to the high power loss arising therein in the case of disconnection from the first transistor T1 or from the second transistor T2 (the energy stored in the actuator 101 is reduced more quickly as a result). The Zener diodes are polarized accordingly so that they fulfil this function. The polarization can be achieved by corresponding contacting of the bulk contact of the FET.

The supplementary switch 160 and the supplementary diode 170, which are connected in series between an input and output of the load 101, serve to remove the load 101, that is to say to reduce the field energy in the case of sudden disconnection of the load 101 caused by opening the first switch 110 and/or the third switch 130. By closing the supplementary switch 160, a circuit is thus connected between the load, the supplementary switch 160 and the supplementary diode 170. The diode is polarized in such a way that the circuit is excited during the removal. The removal of the load 101 is slowed since a circulating current flows across said circuit over a certain period of time. The purpose of the slow removal is to retain the energy stored in the actuator 101 in PWM operation (by the first transistor T1 or the second transistor T2). On the other hand, when the supplementary switch 160 is open, the load 101 is removed via the first switch 110 to the ground 107. This removal process takes place more quickly but with the disadvantage that sudden voltage peaks can arise (due to the field energy present). This flow of current for the removal is effected via the first diode 151 for the actuator 101 shown (or other individual actuators) or analogously via the second and third diode 152, 153 for all the actuators and said flow is effected quickly since a higher potential is present (in the case of an open supplementary switch 160), which causes a higher current flow than in the case of slow removal.

The switching design, as is shown in FIG. 3, therefore comprises a high-side switch 130 consisting of a polarity-reversal field-effect transistor T3 (in this example the third FET 143) and a switching field-effect transistor T2 (in this example the second FET 142). In the case of disconnection, to protect the low-side switch 110 (that is to say the first FET 141) from overvoltage due to the magnetic energy stored in the load, the protective diode D1 (for example the Zener diode 151) is used, which, in the case of disconnection and when voltage peaks arise, becomes conducting and reduces this energy. A protective diode of this kind can also be a constituent of one or more high-side and/or low-side switches (such as the second diode 152 in the second switching unit 132, for example).

The additional switch S1 and the diode D4 (supplementary diode 170) can optionally be interchanged along the current path. Due to the additional switch (in this example the supplementary switch 160) before the diode D4, it is therefore likewise possible to switch between quick removal (supplementary switch 160 is open) and slow removal (supplementary switch 160 is closed).

Figure 4:
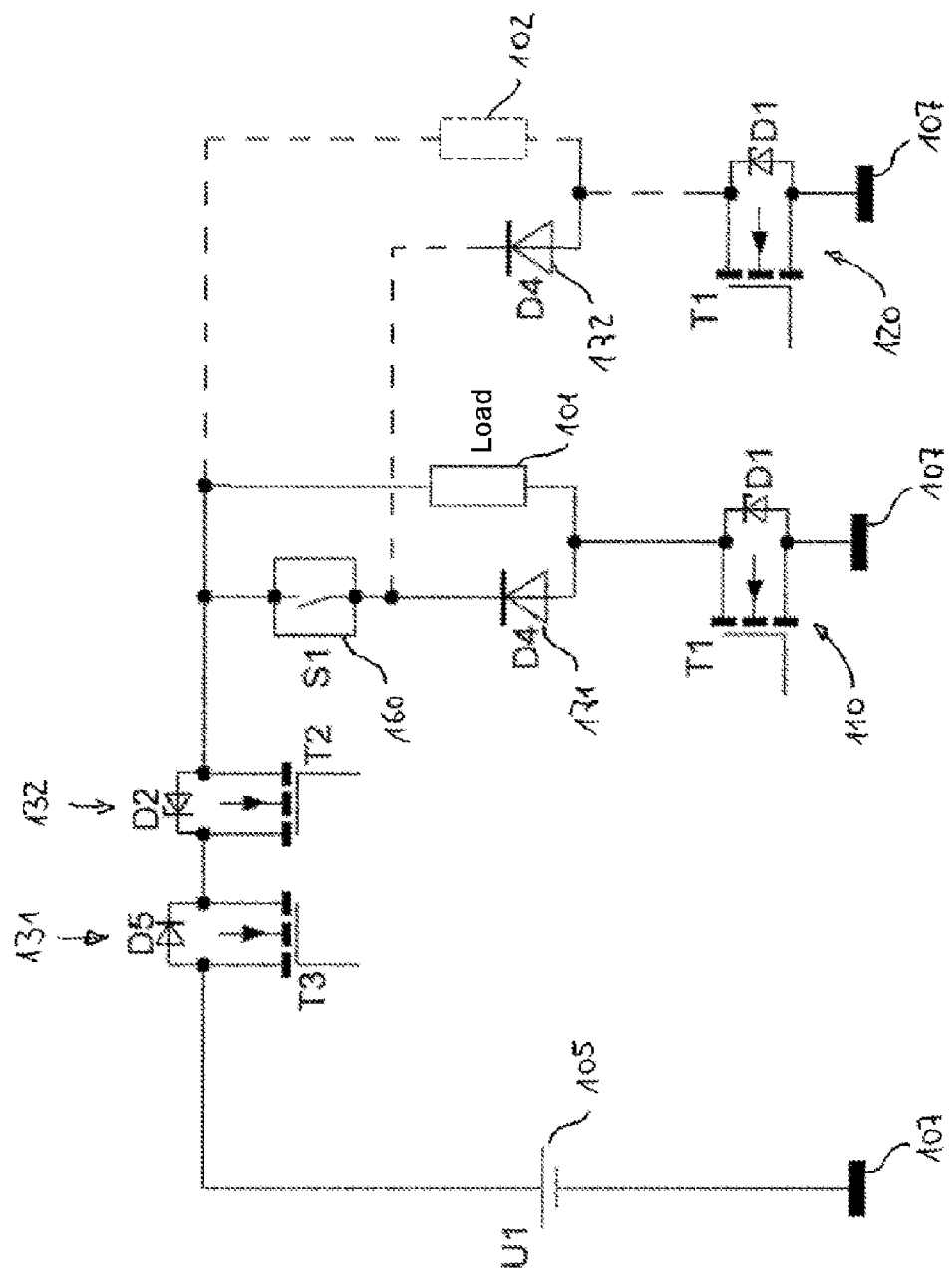
FIG. 4 shows a further exemplary embodiment having semiconductor components as switches.

FIG. 4 shows a further exemplary embodiment of the present invention that differs from the exemplary embodiment of FIG. 3 only in that a common supplementary switch 160 for a plurality of load elements 101, 102, . . . is present. The additional load elements 102 are arranged as in FIG. 2, wherein, in parallel with each further load element, a further supplementary diode D4 and the supplementary switch S1 are connected in series in such a way that the further supplementary diode (for example the further supplementary diode 172) is connected between the supplementary switch S1 and the respective load 102.

As already mentioned above, the exemplary embodiments of FIGS. 3 and 4 can accordingly be implemented analogously for a plurality of actuators (in addition to the load 101) and a further switch between the additional load and the ground 107 can optionally be present for each additional load. This also makes it possible to switch the further load elements selectively. As shown in FIG. 4, however, a common supplementary switch 160 may also (but does not have to) be present for all or several of the actuators.

In the exemplary embodiment of FIG. 4, the supplementary switch S1 therefore serves as a common switch for switching over between quick removal and slow removal for all or at least some of the actuators (load elements). The other mode of operation is identical to the embodiment of FIG. 3, with the result that it is not necessary to describe the elements again.

Figure 5:
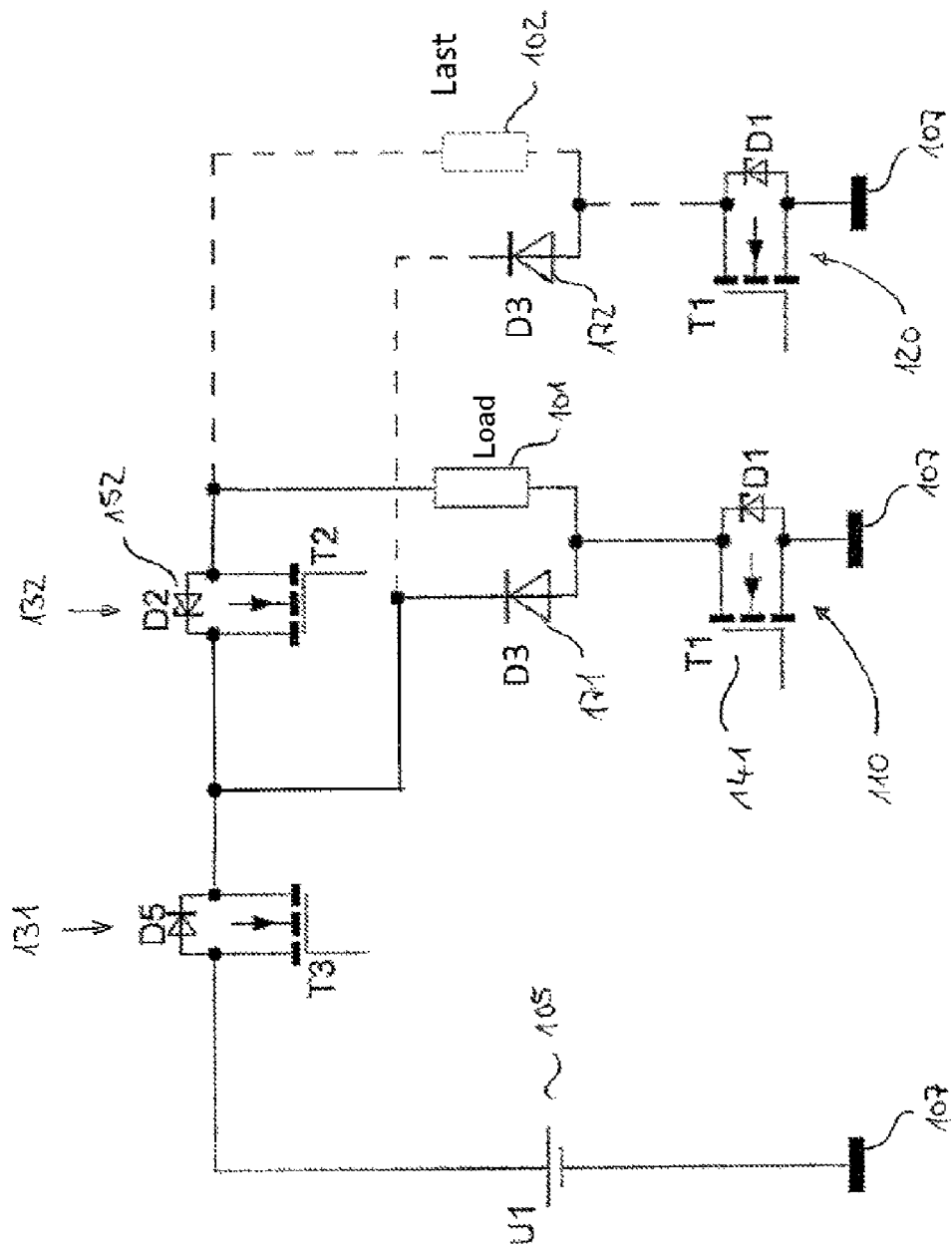
FIG. 5 shows a further optimized exemplary embodiment.

FIG. 5 shows a further exemplary embodiment that can be considered as an optimization of the exemplary embodiment from FIG. 4. Said FIG. 5 differs from FIG. 4 only in that the supplementary switch 160 is not formed. Instead, the supplementary diodes 171, 172 contact the current path between the first switching unit 131 and the second switching unit 132. This therefore achieves a situation in which individual actuators are quickly disconnected by the second switching unit 132 (T2/D2). In this case, the second diode 152 (D2) absorbs the disconnection power loss of all the actuators previously activated. In this exemplary embodiment, slow switching can be performed (due to PWM operation) by the first transistor 141 (T1) and the supplementary diode 171 (D3). Another description of the components already described above is not necessary here.

In further exemplary embodiments, the high-side switches (the first and second switching unit 131, 132) can be embodied as cost-effective relays. This is useful, in particular, when time-critical applications are not desired since the relays generally switch more slowly than semiconductor switches. It is further advantageous that the high-side switches 131, 132 are configured as semiconductor switches instead of as mechanical relays since a lower switching time can be achieved thereby. However, this is not compulsory and, as mentioned, depends on the envisaged application.

Figure 6:
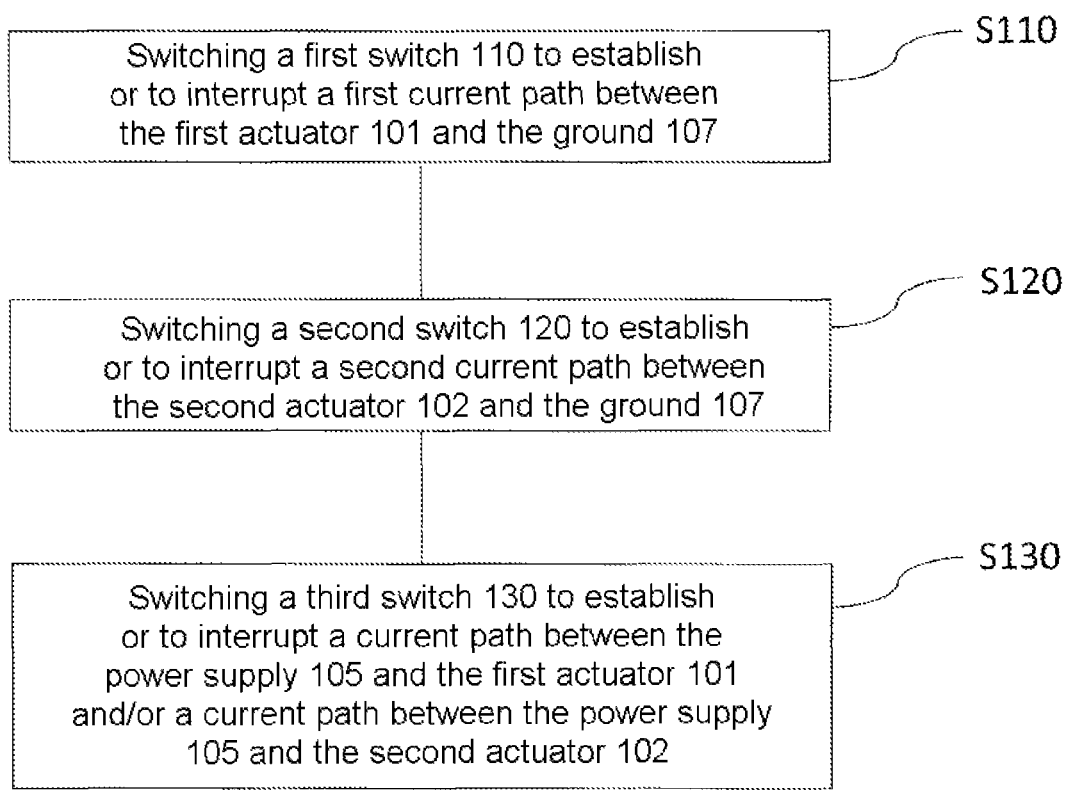
FIG. 6 shows a flow chart for a method for switching in accordance with one exemplary embodiment of the present invention.
Figure 7:
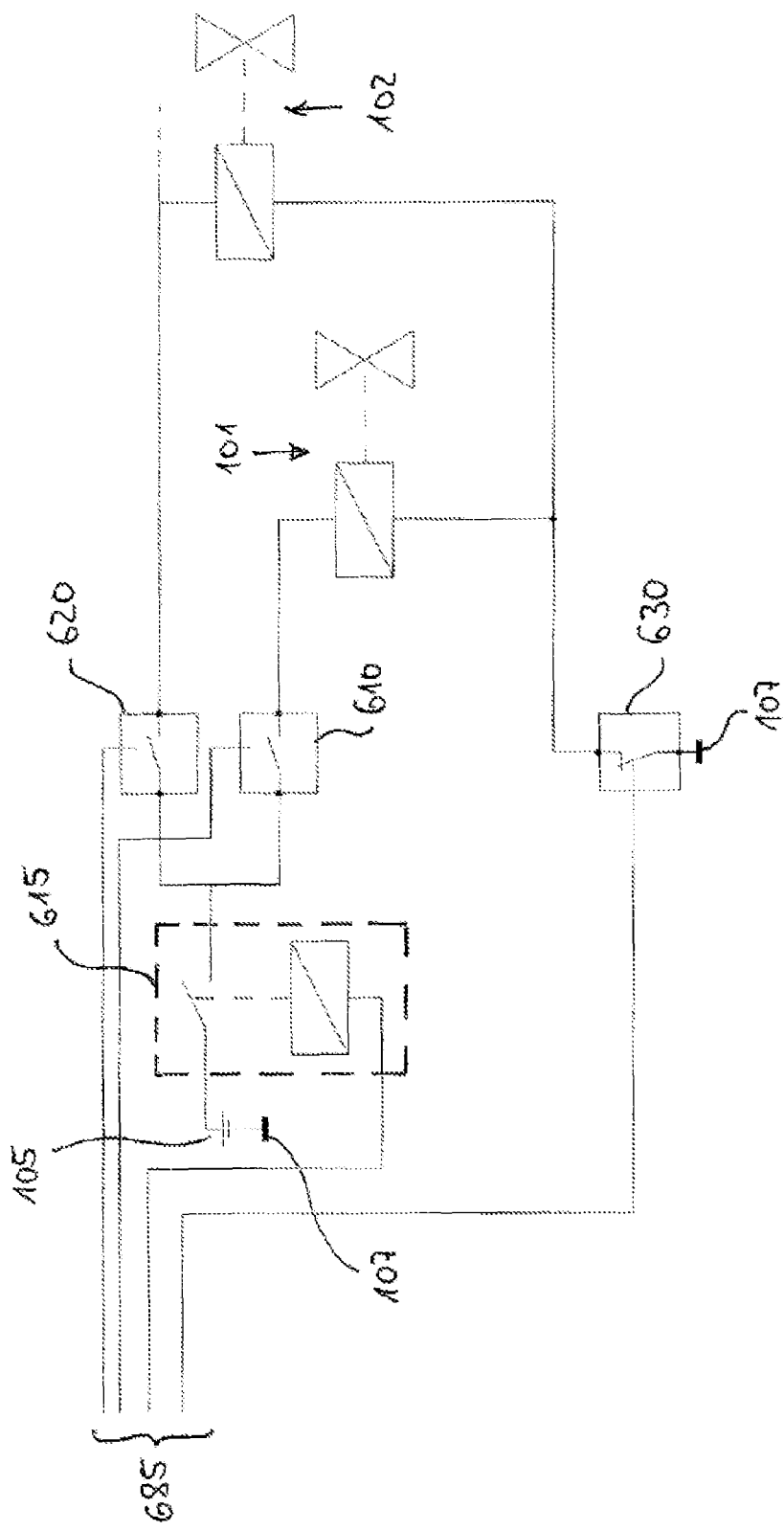
FIG. 7 shows a conventional switching design.

FIG. 6 shows a flow chart of a method according to the invention for switching one of the apparatuses described above. The method comprises: switching S110 a first switch 110 in order to establish or to interrupt a first current path between the first actuator 101 and the ground 107 and/or switching S120 a second switch 120 in order to establish or to interrupt a second current path between the second actuator 102 and the ground 107. The method further comprises switching S130 a third switch 130 in order to establish or to interrupt a current path between the power supply 105 and the first actuator 101 and/or a current path between the power supply 105 and the second actuator 102. As a result of the switching, the third switch 130 closes or opens the current path to the first actuator 101 and/or simultaneously to the second actuator 102.

The stated order of the steps does not imply any temporal sequence or only insofar as is absolutely necessary.

An electrical connection does not necessarily have to comprise a direct electrical connection. Within the context of the present invention, an electrical connection is to be understood as meaning forming a current path that permits a flow of electrical charge carriers between the components. The term "coupling" is to be interpreted as comprising any connection via which energy can be transported.

The features of the invention that are disclosed in the description, the claims and the figures can be essential for the implementation of the invention both individually and in any desired combination.

The list of reference numerals is as follows:
101 First actuator
102 Second actuator
105 Power supply (or voltage source)
107 Ground
110 First switch
120 Second switch
130 Third switch
131 First switching unit
132 Second switching unit
141, 142, . . . Transistors
151, 152, . . . Diodes
160 Supplementary switch
170, 171, . . . Supplementary diodes
180 Control unit
185 Control connections

The invention claimed is:

1. A switching apparatus for switching a first actuator and a second actuator between a power supply and a ground, comprising:
    a first switch for switching a first current path between the first actuator and the ground;
    a second switch for switching a second current path between the second actuator and the ground; and
    a third switch for switching a current path between the power supply and the first actuator and a current path between the power supply and the second actuator;
    wherein a first unit includes the first switch and a first actuator, which is in series between the first switch and the ground,
    wherein a second unit includes the second switch and a second actuator, which is in series between the second switch and the ground,
    wherein the first unit and the second unit are parallel to each other or are interconnected with one another in antiseries to provide polarity-reversal protection, and together form a switching unit,
    wherein the third switch is in series with the switching unit, and
    wherein, as a result of the switching, the third switch simultaneously closes or opens the current path to the first actuator and to the second actuator.

2. The switching apparatus of claim 1, wherein the first switch and the second switch are low-side switches and the third switch is a high-side switch.

3. The switching apparatus of claim 1, wherein the first switch and/or the second switch and/or the third switch includes a semiconductor switching unit or a relay.

4. The switching apparatus of claim 3, wherein the semiconductor switching unit includes a field-effect transistor.

5. The switching apparatus of claim 4, wherein the field-effect transistor of the first switch is a first field-effect transistor and the field-effect transistor of the second switch is a further field-effect transistor and the switching apparatus includes a first voltage-limiting element and a further voltage-limiting element, wherein the first voltage-limiting element is formed in parallel with the first field-effect transistor and the further voltage-limiting element is formed in parallel with the further field-effect transistor.

6. The switching apparatus of claim 1, wherein the third switch has a first switching unit and a second switching unit, which are connected in series and can be switched independently of one another.

7. The switching apparatus of claim 6, wherein the first switching unit and the second switching unit of the third switch each include a field-effect transistor and are interconnected with one another in antiseries to provide polarity-reversal protection.

8. The switching apparatus of claim 7, wherein the first switching unit is connected between the second switching unit and the power supply and a voltage-limiting element is formed in parallel with the field-effect transistor of the second switching unit.

9. The switching apparatus of claim 6, further comprising:
    at least one supplementary diode and at least one supplementary switch, which are each interconnected in series and bypass the first actuator and/or the second actuator to accelerate or to slow the removal of the first actuator and/or the second actuator by switching the at least one supplementary switch.

10. The switching apparatus of claim 9, wherein the at least one supplementary diode is a plurality of supplementary diodes and the at least one supplementary switch is one supplementary switch, which are connected so that, in each case, one of the plurality of supplementary diodes and the supplementary switch are connected in parallel with the first and with the second actuator such that closed circuits for the first and the second actuator are formed by closing the one supplementary switch to accelerate removal of the first actuator and the second actuator.

11. The switching apparatus of claim 1, further comprising:
a control unit to close or to open the first switch together with the third switch or the second switch together with the third switch.

12. The switching apparatus of claim 11, wherein the control unit is configured to close or to open the third switch before or after the first switch or before or after the second switch.

13. The switching apparatus of claim 11, wherein the control unit is configured to accelerate the removal of the first actuator and/or the second actuator by opening the at least one supplementary switch.

14. A brake system of a vehicle, comprising:
a first pressure-controlled valve;
a second pressure-controlled valve; and
a switching apparatus for switching a first actuator and a second actuator between a power supply and a ground, including:
a first switch for switching a first current path between the first actuator and the ground;
a second switch for switching a second current path between the second actuator and the ground; and
a third switch for switching a current path between the power supply and the first actuator and a current path between the power supply and the second actuator,
wherein, as a result of the switching, the third switch simultaneously closes or opens the current path to the first actuator and to the second actuator,
wherein a first unit includes the first switch and the first actuator, which is in series between the first switch and the ground,
wherein a second unit includes the second switch and the second actuator, which is in series between the second switch and the ground,
wherein the first unit and the second unit are parallel to each other or are interconnected with one another in antiseries to provide polarity-reversal protection, and together form a switching unit,
wherein the third switch is in series with the switching unit, and
wherein the first actuator is the first pressure-controlled valve and the second actuator is the second pressure-controlled valve.

15. A method for switching a first actuator and a second actuator between a power supply and a ground, the method comprising:
performing, via a switching apparatus, the following:
switching a first switch to establish or to interrupt a first current path between the first actuator and the ground; and/or
switching a second switch to establish or to interrupt a second current path between the second actuator and the ground; and
switching a third switch to establish or to interrupt a current path between the power supply and the first actuator and/or a current path between the power supply and the second actuator;
wherein the switching apparatus includes a first unit and second unit,
wherein the first unit includes the first switch and the first actuator, which is in series between the first switch and the ground,
wherein the second unit includes the second switch and the second actuator, which is in series between the second switch and the ground,
wherein the first unit and the second unit are parallel to each other or are interconnected with one another in antiseries to provide polarity-reversal protection, and together form a switching unit,
wherein the third switch is in series with the switching unit, and
wherein as a result of the switching, the third switch simultaneously closes or opens the current path to the first actuator and to the second actuator.

\* \* \* \* \*